United States Patent [19]

Shimizu et al.

[11] Patent Number: 4,708,904
[45] Date of Patent: Nov. 24, 1987

[54] SEMICONDUCTOR DEVICE AND A METHOD OF MANUFACTURING THE SAME

[75] Inventors: Masahiro Shimizu; Tatsuo Okamoto; Katsuhiro Tsukamoto, all of Itami, Japan

[73] Assignee: Mitsubishi Denki Kabushiki Kaisha, Tokyo, Japan

[21] Appl. No.: 798,639

[22] Filed: Nov. 15, 1985

[30] Foreign Application Priority Data

Jan. 17, 1985 [JP] Japan .................................... 60-7905

[51] Int. Cl.$^4$ .......................... B32B 3/00; B44C 1/22; C23C 14/00; B05D 5/12
[52] U.S. Cl. .................................. 428/209; 428/901; 156/656; 156/657; 204/192.34; 427/96; 430/396
[58] Field of Search ................. 156/656, 657; 428/209, 428/901; 204/192 E, 192 SP; 357/67, 71; 427/88, 93, 95; 430/311, 396

[56] References Cited

U.S. PATENT DOCUMENTS

| | | | |
|---|---|---|---|
| 3,286,312 | 11/1966 | Davis et al. | 22/129 |
| 4,227,944 | 10/1980 | Brown et al. | 148/6 |
| 4,443,930 | 4/1984 | Hwang et al. | 29/571 |
| 4,472,237 | 9/1984 | Deslauriers et al. | 156/643 |
| 4,486,266 | 12/1984 | Yamasuchi | 156/643 |

OTHER PUBLICATIONS

"Refractory Silicides for Integrated Circuits", by S. P. Murarka, J. Vac. Sci. Technol., 17(4), Jul./Aug. 1980, pp. 775-792.

Primary Examiner—John E. Kittle
Assistant Examiner—Patrick J. Ryan
Attorney, Agent, or Firm—Lowe Price LeBlanc Becker & Shur

[57] ABSTRACT

A semiconductor device and a method of manufacturing the same which comprises a semiconductor substrate and a conductive region formed thereon in multilayer structure of a film of refractory metal or refractory metal silicide inferior in corrosion resistance against a solution containing hydrofluoric acid and a film of refractory metal silicide excellent in corrosion resistance against the solution containing hydrofluorine acid and low electric resistance formed on the same.

11 Claims, 12 Drawing Figures

FIG.1A PRIOR ART

1: SEMICONDUCTOR SUBSTRATE
2: FIELD OXIDE FILM
3: ION IMPLANTED LAYER
4: GATE INSULATING FILM
5: POLYSILICON FILM
6: TITANIUM SILICIDE FILM

FIG.1B PRIOR ART 7a, 7b: SOURCE-DRAIN DIFFUSION LAYER

FIG.1C PRIOR ART

8: INSULATOR FILM
9a, 9b: CONTACT HOLE
10a, 10b: ALUMINUM FILM
11: PASSIVATION FILM

12: MOLYBDENUM SILICIDE FILM

5 : POLYSILICON FILM
6 : REFRACTORY METAL OR
    REFRACTORY METAL SILICIDE
12: MOLYBDENUM SILICIDE FILM

SEMICONDUCTOR DEVICE AND A METHOD OF MANUFACTURING THE SAME

BACKGROUND OF THE INVENTION

1. Field of the Invention

The present invention relates to a semiconductor device which particularly includes a metal-oxide semiconductor element (hereinafter referred to as "MOS transistor"), and more particularly, it relates to structure of a gate electrode and interconnection of a semiconductor integrated circuit device and a method of manufacturing the same.

2. Description of the Prior Art

Figure 1A:
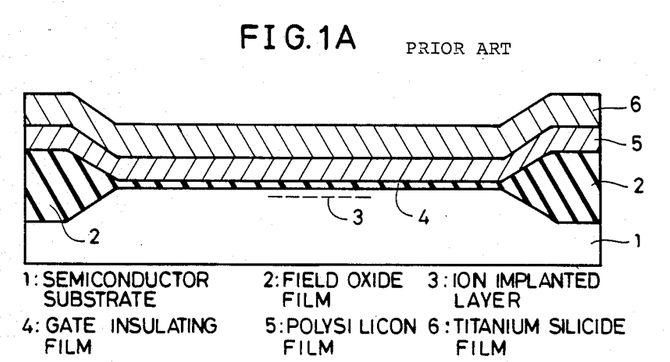
FIGS. 1A to 1C are sectional views showing principal steps of a conventional method of manufacturing a semiconductor device.
Figure 1B:
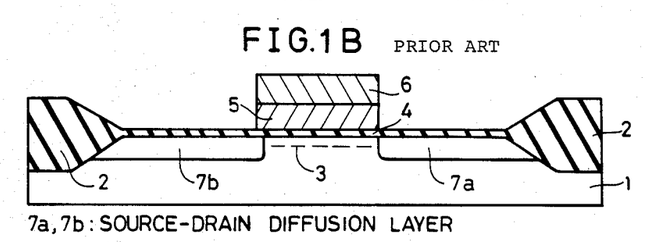
Figure 1C:
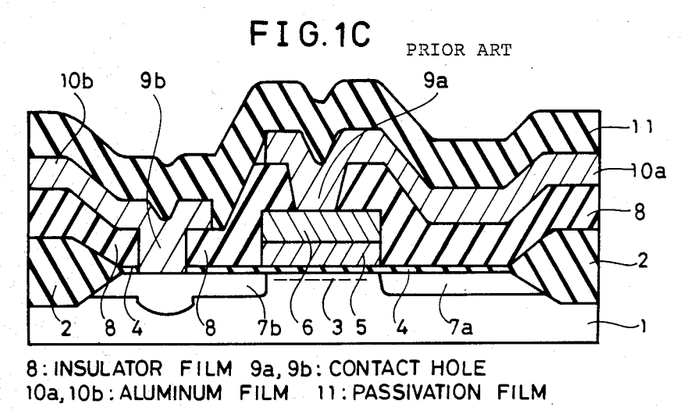

FIGS. 1A to 1C are sectional views showing principal steps of manufacturing a conventional MOS transistor. Description is now made on the steps of manufacturing the conventional MOS transistor with reference to FIGS. 1A to 1C.

Referring to FIG. 1A, a field oxide film 2 for electrically separating neighboring elements is selectively formed on a major surface of a first conductive type semiconductor substrate 1 by a thermal oxidation process. Then an ion-implanted layer 3 for controlling the threshold voltage of the MOS transistor is formed on the semiconductor substrate 1 in a region corresponding to a gate region by an ion implantation method. A gate insulator film 4 is formed on the major surface of the semiconductor substrate 1, whereupon a polycrystalline silicon film 5 is formed on the insulator film 4 and the field oxide film 2 using a chemical vapor deposition (CVD) method or the like. Thereafter a titanium silicide film 6 is formed on the polycrystalline silicon film 5. The titanium silicide film 6 is formed by any of a sputtering method, vacuum evaporation method, CVD method and direct reaction between titanium and polycrystalline silicon.

Referring to FIG. 1B, the silicide film 6 and the polycrystalline silicon film 5 are patterned in the said order by photolithography and etching processes to leave the silicide film 6 and the polycrystalline silicon film 5 only in a predetermined region (gate region in FIG. 1B). Then second conductive type impurities are ion-implanted into a predetermined region of the semiconductor substrate 1 and heat treatment is performed to anneal the ion-implanted layer 3 to remove distortion and defects from the same, thereby to form source-drain impurity-diffusion layers 7a and 7b. Between the patterning step and the step of ion-implanting the impurities, heat treatment may be performed to reduce resistance of the patterned films. Referring to FIG. 1C, an insulator film 8 is formed by the CVD method or the like to entirely cover the exposed surface, and then heat treatment is performed to densify the insulator film 8 and smooth the surface thereof. Thereafter contact holes 9a and 9b are defined by the photolithography and etching processes to form electrodes (contact hole on the impurity-diffusion layer 7a is omitted in FIG. 1C for the purpose of simplification). The impurities such as phosphor are introduced by a thermal diffusion method or the like in the semiconductor substrate 1 through the contact holes 9a and 9b so that impurity-diffusion layers are reliably formed on the semiconductor substrate 1 in the regions of the contact holes 9a and 9b. A film of aluminum or aluminum alloy etc. is formed by a sputtering method or the like entirely on the exposed surface to be patterned by the photolithography and etching processes thereby to form interconnection films 10a and 10b. Finally a passivation film 11 is formed by the CVD method or the like over the entire surface to protect the same.

In the aforementioned steps, it is required to clean the surface of the semiconductor substrate 1 and remove thin oxide films grown thereon in the regions of the contact holes 9a and 9b by wet chemical processing immediately before performing the respective heat treatment processes and before the step of forming the film of aluminum or aluminum alloy etc. The oxide films are removed by a solution containing hydrofluoric acid or a mixed solution thereof. However, a gate electrode generally includes a titanium silicide film, which is etched at a rapid etching rate of about 1200 to 1300 Å/min. even if the ratio of water to hydrofluoric acid is 50:1 in the dilute solution employed. Thus, the said chemical processing cannot be performed through a solution containing hydrofluoric acid.

In the conventional structure of the multilayer gate electrode and interconnection formed by the polysilicon film and titanium silicide film etc. and in a conventional method of manufacturing the same, as hereinabove described, the titanium silicide film etc., which is inferior in corrosion resistance against hydrofluoric acid, is inevitably etched by chemical processing performed before the respective heat treatment processes and before formation of the aluminum electrode through a solution containing hydrofluoric acid etc., whereby film resistance or the like is increased to deteriorate properties of the semiconductor element. Such a disadvantage is disclosed in, e.g., "Refractory Silicides for Integrated Circuits" by S. P. Murarka, J. Vac. Sci. Technol. 17(4), July/August 1980, pp. 775-792.

When no wet etching is performed through a solution containing hydrofluoric acid, further, such a critical defect is caused that the aluminum electrode cannot be in contact with the semiconductor substrate or the gate electrode, whereby harmful impurities are introduced in the semiconductor substrate in the process of heat treatment to extremely deteriorate the properties of the element.

SUMMARY OF THE INVENTION

Accordingly, an object of the present invention is to overcome the aforementioned disadvantages of the prior art by providing novel structure of a gate electrode and interconnection of a semiconductor device and a method of manufacturing the same, which can prevent a silicide film from being etched by a solution containing hydrofluoric acid in wet chemical processing steps performed before respective heat treatment processes and formation of the aluminum electrode.

The gate electrode and interconnection etc. of the semiconductor device according to the present invention comprises a refractory metal silicide film which is low in electric resistance and excellent in corrosion resistance against a solution containing hydrofluoric acid formed on a refractory metal or metal silicide film which is inferior in corrosion resistance against the solution containing hydrofluoric acid.

By virtue of the aforementioned structure, the refractory metal silicide film in the uppermost part of the gate electrode and interconnection is corrosion-resistant against the solution containing hydrofluoric acid, to enable employment of the solution containing hydrofluoric acid for wet cleaning of a semiconductor substrate prior to heat treatment. Further, a thin silicon oxicide film grown on the semiconductor substrate in the region of contact holes can be removed by the solution containing hydrofluoric acid, thereby to prevent deterioration of properties of the element by harmful impurities while attaining stable contact between the aluminum electrode and the semiconductor substrate or gate electrode.

These and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the present invention is now described with reference to the accompanying drawings. FIGS. 2A to 2D are sectional views showing principal steps of a method of manufacturing a semiconductor device according to the present invention, for illustrating the structure of a gate electrode and a method of manufacturing the same.

Figure 2A:
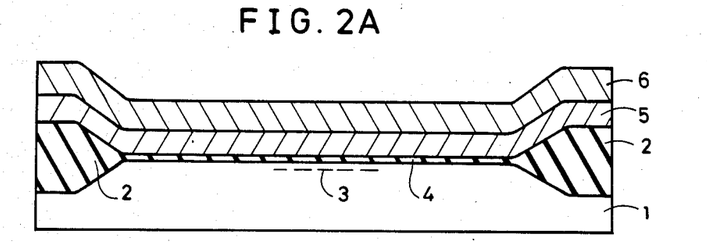
FIGS. 2A to 2D are sectional views showing steps of a method of manufacturing a gate electrode according to an embodiment of the present invention.

FIG. 2A shows a polycrystalline silicon film 5 and a titanium silicide film 6 provided thereon, both formed in a similar manner to the conventional method.

Figure 2B:
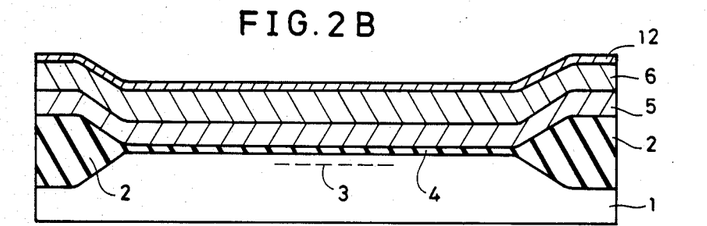

In a step as shown in FIG. 2B, formed by the sputtering method is a film 12 of, e.g., molybdenum silicide which is smaller in thickness than the silicide film 6 serving as a first layer and excellent in corrosion resistance against the solution containing hydrofluoric acid, as the feature of the present invention. Thickness of the molybdenum silicide film 12 is so reduced as to prevent disadvantages such as increased difference in level from other regions.

Figure 2C:
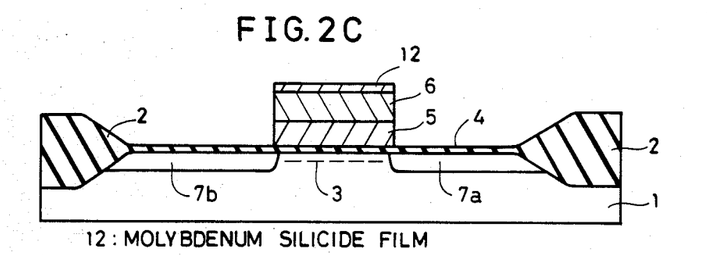

In a step as shown in FIG. 2C, the second layer film 12 of, e.g., molybdenum silicide, the first layer silicide film 6 and the polycrystalline silicon film 5 are patterned in the said order to form a multilayer gate electrode film. Then impurities are introduced by the ion implantation method in the semiconductor substrate, the entire surface of which is then subjected to wet cleaning by a solution containing hydrofluoric acid. Thereafter heat treatment is performed for annealing the ion-implanted layer to form source-drain impurity-diffusion layers 7a and 7b. Between the patterning and ion implanation processes, heat treatment may be performed to redue the resistance of the gate electrode film. The uppermost layer of the gate electrode film is formed by the film 12 of, e.g., molybdenum silicide which is corrosion-resistant against the solution containing hydrofluoric acid, and hence the said heat treatment can be performed after the wet cleaning through the solution containing hydrofluoric acid.

Figure 2D:
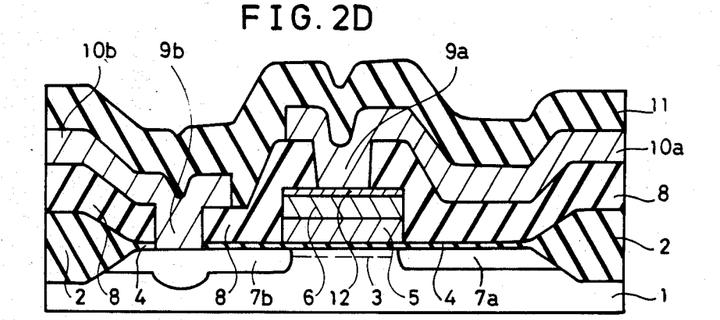

In a step as shown in FIG. 2D, after an insulator film 8 is formed over the entire surface by the CVD method etc., contact holes 9a and 9b are formed for providing electrodes in predetermined positions by the photolithography and etching processes. Thereafter wet cleaning is performed with the solution containing hydorfluoric acid and impurities such as phosphor are introduced through the contact holes 9a and 9b by the thermal diffusion method. At this time, a silicon oxide film (e.g., PSG) of 100 to 400 Å in thickness including, e.g., phosphor in high concentration is grown on the semiconductor substrate in the regions of the contact holes 9a and 9b. Since the silicon oxide film of, e.g., phosphosilicate glass is insulative, deposition of an aluminum electrode film thereon causes such a critical defect that the aluminum electrode cannot be in contact with the silicon substrate or the gate electrode. Therefore, the silicon oxide film of, e.g., phospho-silicate glass is removed by the hydrofluoric-acid containing solution and then a film of aluminum or aluminum alloy etc. is formed over the entire surface by the sputtering method or the like. In the case the impurities are introduced by the ion implantation method in place of the thermal diffusion method, the heat treatment process is also required for annealing the ion-implanted layer and electrically activating the introduced impurities. Although the heat treatment is performed in a non-oxidation atmosphere, a thin silicon oxide film of several ten Å in thickness is inevitably grown by residual air in the heat treating furnace. Thus, it is necessary to perform light-etching by the solution containing hydrofluoric acid. According to the embodiment of the present invention, formed and exposed in the uppermost part of the gate electrode is the refractory metal silicide film 12 which is corrosion-resistant against the solution containing hydrofluoric acid, and hence no problem is caused by the light-etching, whereby the aluminum electrode can be stably in electrically contact with the silicon substrate or the gate electrode.

Then patterning is performed by the photolithography and etching processes to form interconnection films 10a and 10b leaving the film of aluminum or aluminum alloy only in a predetermined region. Finally a passivation film 11 is formed over the entire surface by the CVD method etc.

Figure 3:
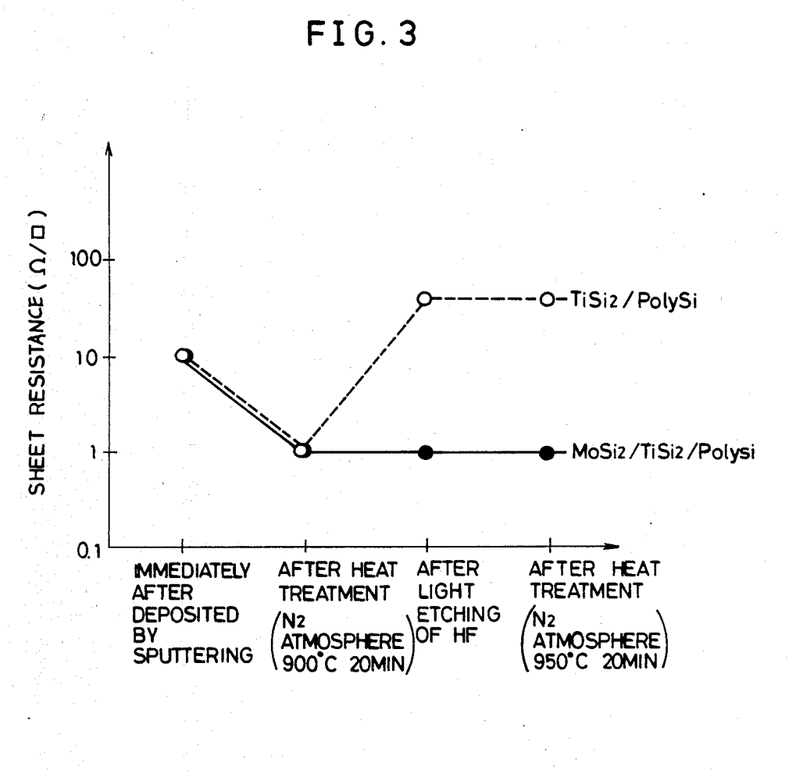
FIG. 3 illustrates changes in sheet resistance in respective processes of a conventional method of manufacturing a gate electrode and the method according to the embodiment of the present invention.

FIG. 3 illustrates changes in sheet resistance in respective steps with respect to a gate electrode according to the present invention in structure of molybdenum silicide/titanium silicide/polysilicon and a conventional gate electrode in structure of titanium silicide/polysilicon. Referring to FIG. 3, description is now made on comparison in sheet resistance of the gate electrode according to the present invention with the conventional gate electrode.

In each of the gate electrodes according to the present invention and the conventional method, a titanium silicide film is deposited in thickness of 2500 Å by the sputtering method on a polycrystalline silicon film (sheet resistance: 40 Ω/□) of 3000 Å in thickness. In the embodiment of the present invention, a molybdenum silicide film of 300 Å is further deposited by the sputtering method. The sheet resistance in each of the gate electrodes according to the present invention and the conventional method is about 10 Ω/□ in this stage. Then heat treatment is performed at 900° C. for 20 minutes in a nitrogen atmosphere to reduce the resistance of the silicide film to about 1.5 Ω/□ in either case. Then, prior to annealing of the ion-implanted layer to form the source-drain layers, light-etching is performed for 30 seconds by a solution containing hydrofluoric acid (the ratio of hydrofluoric acid to water is 1:50) for wet cleaning. In the conventional gate electrode, the exposed titanium silicide film is significantly etched by the light-etching whereby the polycrystalline silicon film may be partially exposed and the sheet resistance of the gate electrode is sharply increased. In the gate electrode film according to the present invention, on the other hand, the molybdenum silicide film formed in the uppermost part is not etched by the solution containing hydrofluoric acid, and hence the sheet resistance is not changed at all. Then heat treatment is performed at 950° C. for 20 minutes in a nitrogen atmosphere for annealing the ion-implanted layer. The molybdenum silicide/titanium silicide/polysilicon structure according to the present invention is extremely thermally stable, and the sheet resistance thereof is never changed.

Figure 4A:
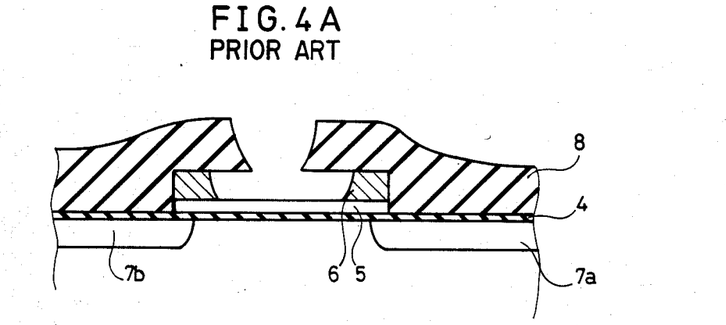
FIG. 4A is a typical sectional view showing a contact hole defined on the gate electrode according to the conventional method.
Figure 4B:
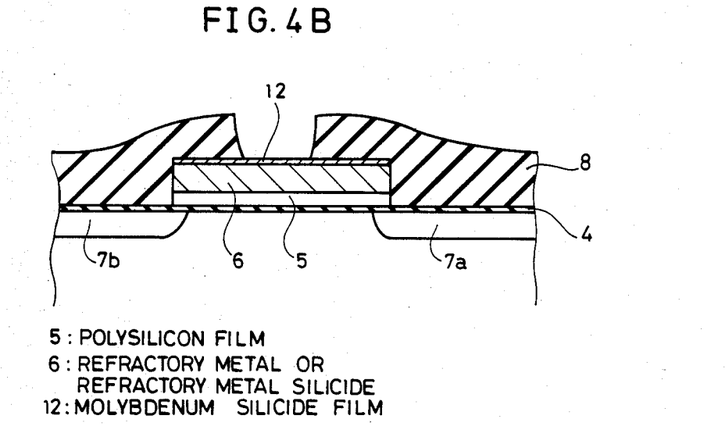
FIG. 4B is a typical sectional view showing a contact hole defined on the gate electrode according to the embodiment of the present invention.

FIGS. 4A and 4B are sectional views typically showing contact holes on gate electrodes. FIG. 4A shows the configuration of the contact hole defined according to the conventional method and FIG. 4B shows the configuration of that according to the present invention. In the conventional gate electrode of the titanium silicide/polysilicon structure, the titanium silicide film exposed in the contact hole is entirely etched in the process of removing the thin oxide film by a solution containing hydrofluoric acid before formation of the aluminum electrode, to be overhung-shaped as shown in FIG. 4A. Consequently, formation of electrode and interconnection results in defining of a cavity between an insulator film 8 and a polysilicon film 5, leading to decrease in thickness of the electrode interconnection to cause disconnection thereof. In the gate electrode of the molybdenum silicide/titanium silicide/polysilicon structure according to the present invention, on the other hand, the molybdenum silicide film is excellent in corrosion resistance against the solution containing hydrofluoric acid, and hence only the thin oxide film is removed with no etching of the gate electrode, thereby to attain good contact with the electrode of aluminum etc., as shown in FIG. 4B.

The aforementioned problem is not caused if no step of removing the thin oxide film is performed by the solution containing hydrofluoric acid before formation of the aluminum electrode, whereas the contact yield is extremely reduced.

Figure 5:
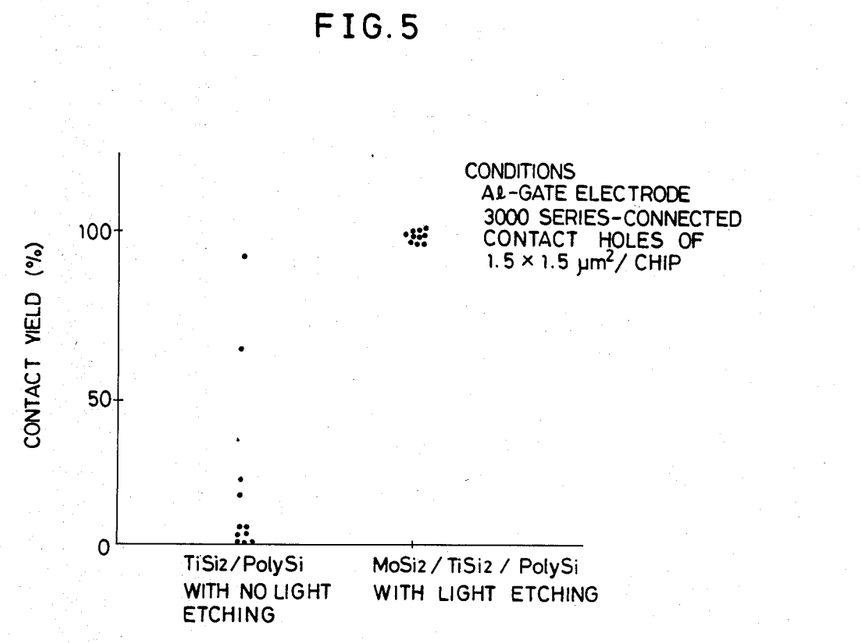
FIG. 5 illustrates contact yields of the conventional gate electrode and that according to the present invention with respect to aluminum electrodes.

FIG. 5 illustrates the contact yields of the conventional gate electrode in the titanium silicide/polysilicon structure in which no light-etching is performed before formation of the aluminum electrode and of the gate electrode in the molybdenum silicide/titanium silicide/polysilicon structure according to the present invention in which light-etching is performed. The contact yields were evaluated through chips respectively with 3000 series-connected contact holes of 1.5×1.5 μm² in size. The chips were determined as defective if imperfect contact was found in any one of the 3000 series-connected contact holes. As obvious from FIG. 5, the contact yield is significantly deteriorated when no light-etching is performed, since the thin oxide film remains in the interface between the aluminum electrode and the gate electrode. On the other hand, the thin oxide film is completely removed by light-etching in the gate electrode of the molybdenum silicide/titanium silicide/polysilicon structure according to the present invention, whereby stable contact is attained to maintain 100 % of the contact yield.

Figure 6:
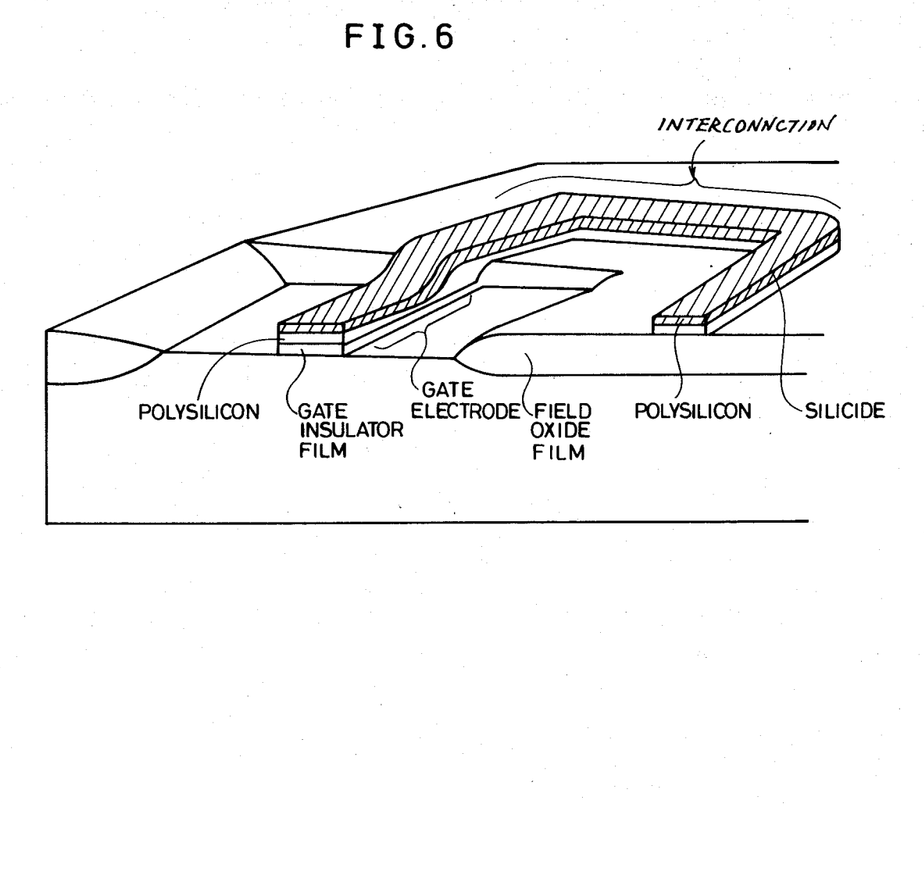
FIG. 6 illustrates structure of a gate electrode and interconnection of a semiconductor device.

Although the above description has been made with respect to a gate electrode, a similar effect can be obtained by application to multilayer interconnection as shown in FIG. 6.

In place of the titanium silicide film employed in the aforementioned embodiment, the first layer may be formed by tantalum titanium silicide, tantalum, molybdenum or tungsten, to obtain a similar effect.

The molybdenum silicide film serving as the second layer may be replaced by a tungsten silicide film, to obtain a similar effect.

Although the molybdenum silicide film is formed by the sputtering method in the aforementioned embodiment, the same may be formed by the ion plating or CVD method.

Further, although the above description has been made on the polycrystalline silicon film formed on the gate insulator film 4, a similar effect can be obtained by forming the first layer of silicide film 6 directly on the gate insulator film 4 to form the refractory metal or refractory metal silicide film 12 serving as the second layer on the first layer silicide film 6.

In addition to the gate electrode of the MOS transistor, the present invention can also be applied to other types of electrodes and interconnection, such as emitter electrodes of a bipolar transistor.

According to the present invention as hereinabove described, the refractory metal silicide film which is low in electric resistance and excellent in corrosion resistance against a solution containing hydrofluoric acid is formed on the refractory metal or refractory metal silicide film which is inferior in corrosion resistance against the solution containing hydrofluoric acid, thereby to obtain a gate electrode, interconnection or the like of high quality which is excellent in corrosion resistance against the solution containing hydrofluoric acid and low in electric resistance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed by a metal-oxide semiconductor element, said metal-oxide semiconductor element comprising a semiconductor substrate and a conductive region formed on said semiconductor substrate, said conductive region including:
 a first conductive layer containing at least a first refractory metal; and
 a second conductive layer formed on said first conductive layer by a refractory metal silicide formed of a different refractory metal than said first refractory metal and having corrosion resistance against a solution containing hydrofluoric acid.

2. A semiconductor device in accordance with claim 1, wherein said second conductive layer is smaller in thickness than said first conductive layer.

3. A semiconductor device in accordance with claim 1, wherein said conductive region is a gate electrode of said metal-oxide semiconductor element.

4. A semiconductor device in accordance with claim 1, wherein said conductive region is an interconnection.

5. A semiconductor device in accordance with claim 1, wherein said conductive region is a gate electrode and interconnection of said metal-oxide semiconductor element.

6. A semiconductor device in accordance with claim 1, wherein said semiconductor device is an integrated circuit device.

7. A semiconductor device in accordance with claim 1, wherein substance forming said first conductive layer is any of molybdenum, tungsten, titanium or tantalum.

8. A semiconductor device in accordance with claim 1, wherein substance forming said first conductive layer is either titanium silicide or tantalum silicide.

9. A semiconductor device in accordance with claim 1, wherein substance forming said second conductive layer is either molybdenum silicide or tungsten silicide.

10. A semiconductor device in accordance with claim 1, wherein thickness of said first conductive layer is selected to be within a range of 1000 to 5000 Å and thickness of said second conductive layer is selected to be within a range of 100 to 500 Å.

11. A method of manufacturing a semiconductor device formed by a metal-oxide semiconductor element having a semiconductor substrate, said method comprising:
   a first step of forming by deposition a first conductive layer containing at least a first refractory metal and having a high melting point on said semiconductor substrate;
   a second step of forming by deposition on the first conductive layer a second conductive layer by a second refractory metal silicide smaller in thickness than said first conductive layer and having corrosion resistance against a solution containing hydrofluoric acid on said first conductive layer;
   a third step of etching away portions of said first and second conductive layers to form a desired pattern in predetermined regions of said first and second layers;
   a fourth step of forming an oxide fim entirely over the exposed substrate and conductive layer surfaces;
   a fifth step of etching contact holes through said oxide film in predetermined positions on said semiconductor substrate;
   a sixth step of cleansing the exposed surface of said substrate through said contact holes using a solution containing hydrofluoric acid; and
   a seventh step of forming by deposition an electrode for making electrical contact with said semiconductor substrate through said contact hole.

* * * * *